United States Patent
Lee et al.

(10) Patent No.: US 9,876,127 B2
(45) Date of Patent: Jan. 23, 2018

(54) BACKSIDE-ILLUMINATED PHOTODETECTOR STRUCTURE AND METHOD OF MAKING THE SAME

(71) Applicant: TAIWAN SEMICONDUCTOR MANUFACTURING COMPANY, LTD., Hsinchu (TW)

(72) Inventors: Wan-Yu Lee, Taipei (TW); Ying-Hao Kuo, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 7 days.

(21) Appl. No.: 14/087,011

(22) Filed: Nov. 22, 2013

(65) Prior Publication Data
US 2015/0145082 A1 May 28, 2015

(51) Int. Cl.
- H01L 31/0232 (2014.01)
- H01L 27/146 (2006.01)
- H01L 31/0224 (2006.01)
- H01L 31/0352 (2006.01)
- H01L 31/105 (2006.01)

(52) U.S. Cl.
CPC .... *H01L 31/02327* (2013.01); *H01L 27/1464* (2013.01); *H01L 27/14638* (2013.01); *H01L 31/022408* (2013.01); *H01L 31/0352* (2013.01); *H01L 31/035236* (2013.01); *H01L 31/105* (2013.01)

(58) Field of Classification Search
CPC ........ H01L 31/105–31/1055; H01L 31/02165; H01L 31/02327; H01L 31/102; H01L 31/047; H01L 27/1464

USPC .................................................. 257/228, 460
See application file for complete search history.

(56) References Cited

U.S. PATENT DOCUMENTS

| | | | | |
|---|---|---|---|---|
| 6,924,541 B2* | 8/2005 | Yoneda | ............. | H01L 31/02161 257/457 |
| 7,420,257 B2* | 9/2008 | Shibayama | ....... | H01L 27/14618 257/433 |
| 7,462,553 B2* | 12/2008 | Metzler | ............... | H01L 27/1446 257/E27.129 |
| 7,714,292 B2* | 5/2010 | Agarwal | ........... | H01L 27/14658 250/370.01 |
| 7,888,766 B2* | 2/2011 | Shibayama | ......... | H01L 27/1446 257/439 |
| 8,564,087 B2* | 10/2013 | Yamamura | .......... | H01L 31/0232 257/432 |
| 8,742,528 B2* | 6/2014 | Yamamura et al. | .......... | 257/436 |
| 8,916,945 B2* | 12/2014 | Sakamoto | ........... | H01L 27/1446 250/200 |
| 2006/0164636 A1* | 7/2006 | Islam | ........................ | G01J 3/44 356/301 |

(Continued)

OTHER PUBLICATIONS

Pierret, Rober E. "Semiconductor Device Fundamentals" p. 355. Published by Addison-Wesley Publishing Company, Inc. in 1996.*

*Primary Examiner* — Jesse Y Miyoshi
*Assistant Examiner* — Tuan A Hoang
(74) *Attorney, Agent, or Firm* — Slater Matsil, LLP (57) ABSTRACT

A backside-illuminated photodetector structure comprising a first reflecting region, a second reflecting region and a semiconductor region. The semiconductor region is between the first reflecting region and the second reflecting region. The semiconductor region comprises a first doped region and a second doped region.

20 Claims, 3 Drawing Sheets

(56) References Cited

U.S. PATENT DOCUMENTS

2011/0073973 A1* 3/2011 Nakaji et al. .................. 257/432
2011/0266644 A1* 11/2011 Yamamura .......... H01L 27/1462
                                                    257/431

* cited by examiner

BACKSIDE-ILLUMINATED PHOTODETECTOR STRUCTURE AND METHOD OF MAKING THE SAME

BACKGROUND

In semiconductor technologies, image sensors are used for sensing a volume of exposed light projected towards the semiconductor substrate. Backside-illuminated photodetectors are an example of an image sensor for sensing a volume of radiation (e.g., light) projected towards the back surface of a semiconductor substrate. The photodetectors may be formed on the front side of the substrate, the substrate being thin enough to allow the radiation incident on the back surface of the substrate to reach the photodetectors.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the disclosed subject matter. Specific examples of components and arrangements are described below to simplify the present disclosure. These are examples and are not intended to be limiting.

This description of the embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

Figure 1:
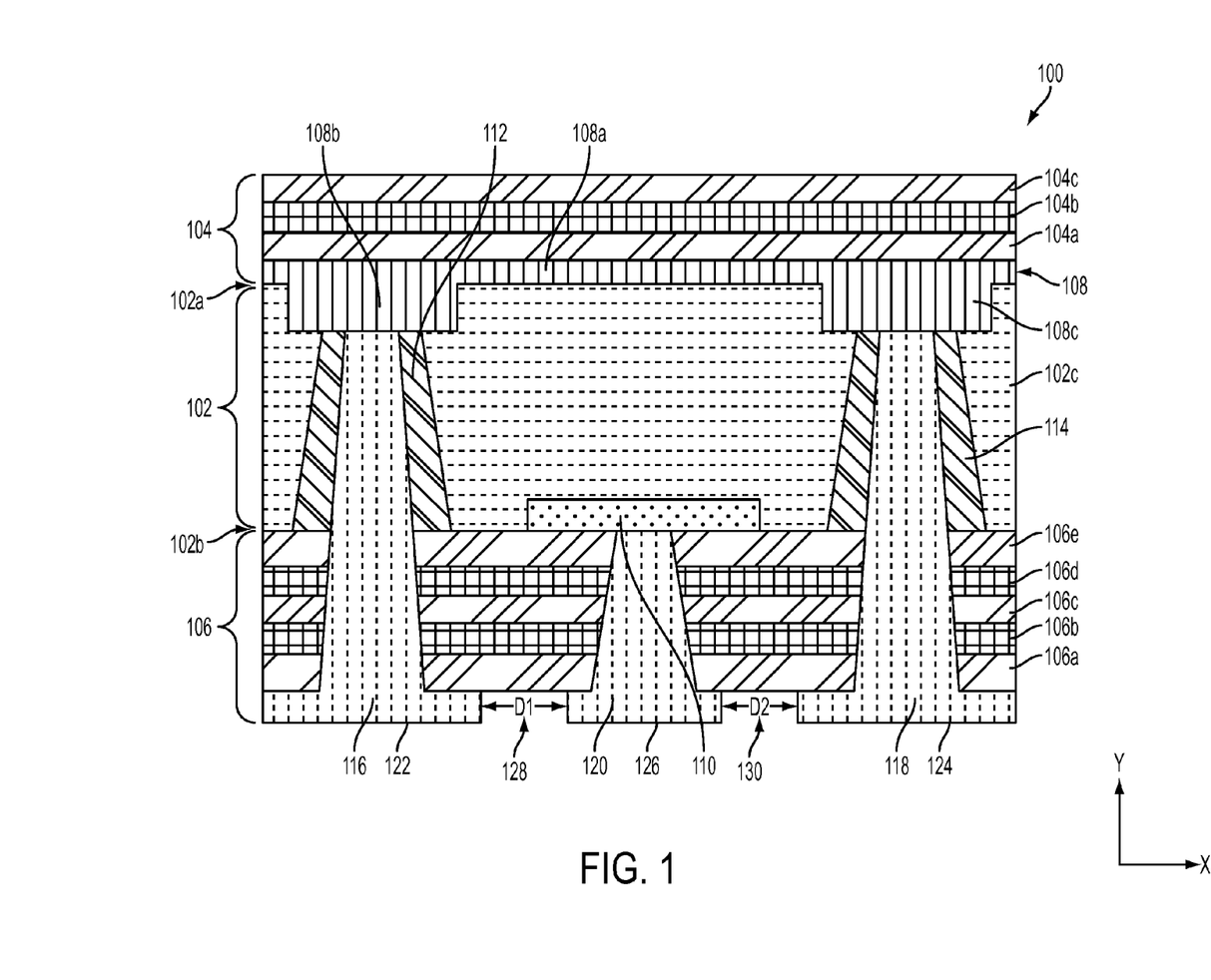
FIG. 1 is a cross sectional view of a Backside-Illuminated (BSI) Photodetector structure in accordance with one or more embodiments.

FIG. 1 is a cross-sectional view of a BSI photodetector structure 100 in accordance with one or more embodiments. BSI photodetector structure 100 comprises a semiconductor region 102 between a first reflecting region 104 and a second reflecting region 106. First reflecting region 104 is over the semiconductor region 102. Semiconductor region 102 is over second reflecting region 106. In some embodiments, the first reflecting region 104 or the second reflecting region 106 is flush against the semiconductor region 102.

First reflecting region 104 is over semiconductor region 102. First reflecting region 104 includes layers of materials, e.g., first reflecting layers 104a, 104b and 104c, having corresponding refractive indices, e.g., $n_{104a}$, $n_{104b}$ and $n_{104c}$, to reflect incident electromagnetic radiation, and improving the efficiency of the BSI photodetector structure 100. In some embodiments, first reflecting region 104 is a distributed Bragg reflector, which uses alternating layers of materials having different refractive indices to reflect emitted light from semiconductor region 102. In some embodiments, the first reflecting region 104 is flush against semiconductor region 102.

First reflecting region 104 includes first reflecting layers 104a, 104b and 104c. In some embodiments, first reflecting region 104 includes one or more reflecting layers. First reflecting layer 104c is over first reflecting layer 104b and first reflecting layer 104a. First reflecting layer 104b is over first reflecting layer 104a. First reflecting layer 104a is over semiconductor region 102.

In some embodiments, first reflecting region 104 is in a two-dimensional plane which is parallel to the semiconductor region 102. In some embodiments, first reflecting region 104 is a three-dimensional structure over semiconductor region 102. In some embodiments, each first reflecting layer 104a, 104b and 104c is in a two-dimensional plane which is parallel to each first reflecting layer 104a, 104b and 104c.

In some embodiments, first reflecting region 104 comprises a stack of alternating layers of reflecting materials, e.g., first reflecting layers 104a, 104b and 104c, with alternating high and low refractive indices. In some embodiments, first reflecting layers 104a and 104c are the same material and the corresponding indices of refraction, $n_{104a}$ and $n_{104c}$, are equal. In some embodiments, first reflecting layer 104a is a different material from first reflecting layer 104b, and the corresponding indices of refraction, $n_{104a}$ and $n_{104b}$, are not equal. In some embodiments, first reflecting layer 104c is a different material from first reflecting layer 104b, and the corresponding indices of refraction, $n_{104}$, and $n_{104b}$, are not equal.

In some embodiments, the refraction index contrast of each alternating high and low refractive index is about 0.5 or greater. In some embodiments, one or more of first reflecting layers 104a, 104b and 104c include high refractive index materials comprising SiNx, AlN, Si, high-k dielectrics; any other suitable material; or combinations thereof. In some embodiments, one or more of first reflecting layers 104a, 104b and 104c include low refractive index materials comprising SiO₂, low-k dielectrics; any other suitable material; or combinations thereof. In some embodiments, at a wavelength ranging from about 1.0 µm to about 3.0 µm, the index of refraction ($n_{104b}$) for the first reflecting layer 104b ranges from about 1.3 to about 2.0. In some embodiments, at a wavelength ranging from about 1.0 µm to about 3.0 µm, the index of refraction ($n_{104a}$) for the first reflecting layer 104a ranges from about 1.6 to about 2.8. In some embodiments, at a wavelength ranging from about 1.0 µm to about 3.0 µm, the index of refraction ($n_{104c}$) for the first reflecting layer 104c ranges from about 1.6 to about 2.8.

In some embodiments, a reflectivity of the first reflecting region 104 ranges from about 20% to about 80%. In some embodiments, the first reflecting region 104 allows incident radiation to be transmitted through the first reflecting region 104 functioning as an optical window. In some embodiments, the number of first reflecting layers ranges from about 2 layers to about 20 layers. In some embodiments, the thickness of each first reflecting layer 104a, 104b and 104c ranges from about 60 nm to about 500 nm. In some embodiments, the first reflecting region 104 is formed by CVD, ALD, or other processes. In some embodiments, the first reflecting region 104 has a multilayer structure and is formed in a multiple-step process. In some embodiments, the thickness of each first reflecting layer 104a, 104b and 104c is controlled in order to collect sufficient radiation. In some embodiments, the semiconductor region 102 is grinded to a thickness range of about 0.5 µm to about 5 µm. In some embodiments, the thickness of each first reflecting layer 104a, 104b and 104c is controlled by chemical mechanical polishing (CMP) or wet etch smoothing of the first side 102a of semiconductor region 102 after grinding/polishing. In some embodiments, the smoothing of the first side 102a of semiconductor region includes silicon wet etching for top surface roughness control. In some embodiments, the silicon wet etching includes using TMAH or KOH; any other suitable material; or combinations thereof; and a mask including SiNx, SiO$_2$ or Cu; any other suitable material; or combinations thereof.

Semiconductor region 102 is over second reflecting region 106. Semiconductor region 102 includes a first side 102a, a second side 102b, a central semiconductor region 102c, a first doped region 108 and a second doped region 110. The second side 102b of semiconductor region 102 is an opposite side of the semiconductor region 102 from the first side 102a. The central semiconductor region 102c is between a first doped region 108 of the semiconductor region and a second doped region 110. In some embodiments, the second side 102b is along the semiconductor region 102/second reflecting region 106 interface. In some embodiments, the first side 102a is along the semiconductor region 102/first reflecting region 104 interface. In some embodiments, the second side 102b is adjacent to the second reflecting region 106. In some embodiments, the first side 102a is adjacent to the first reflecting region 104. In some embodiments, the second side 102b is a frontside surface of the BSI photodetector 100. In some embodiments, the first side 102a is a backside surface of the BSI photodetector 100.

In some embodiments, semiconductor region 102 is in a two-dimensional plane which is parallel to the second reflecting region 106. In some embodiments, semiconductor region 102 is a three-dimensional structure over second reflecting region 106. In some embodiments, first doped region 108 is positioned in an upper portion of semiconductor region 102. In some embodiments, first doped region 108 is adjacent to the first reflecting region 104. In some embodiments, first doped region 108 is adjacent to the first side 102a of semiconductor region 102. In some embodiments, second doped region 110 is positioned in a lower portion of semiconductor region 102. In some embodiments, second doped region 110 is adjacent to the second reflecting region 106. In some embodiments, second doped region 110 is adjacent to the second side 102b of semiconductor region 102.

In some embodiments, semiconductor region 102 is a P-I-N junction, where the P-region and N-region include first doped region 108 and the second doped region 110, and the I-region includes a lightly doped near-intrinsic semiconductor region 102. In some embodiments, the semiconductor region 102 includes a bulk material or a quantum well. In some embodiments, the quantum well includes a single quantum well. In some embodiments, the quantum well includes multiple quantum wells including multiple layers. In some embodiments, the number of quantum well layers ranges from about 1 layer to about 10 layers. In some embodiments, the quantum well includes a layer of Si, Ge, SiGe, SiC, GeSn, SiGeSn or GaN. In some embodiments, the multiple quantum well includes alternating layers of Si, Ge, SiGe, SiC, GeSn, SiGeSn or GaN. In some embodiments, the bulk material includes an elemental semiconductor including silicon or germanium in crystal, polycrystalline, or an amorphous structure, an alloy semiconductor including SiGe, SiC, GeSn, SiGeSn or GaN; any other suitable material; or combinations thereof. In some embodiments, the thickness of the semiconductor region 102 ranges from about 0.2 µm to about 5 µm. In some embodiments, the semiconductor region 102 is formed in a multiple-step process.

First doped region 108 is over the second doped region 110 and the second reflecting region 106. First doped region 108 includes a first transverse region 108a, a first contact region 108b and a second contact region 108c. In some embodiments, first transverse region 108a is across the semiconductor region 102 in a substantially horizontal direction, e.g., x-direction. In some embodiments, first transverse region 108a, first contact region 108b or second contact region 108c is positioned in an upper portion of semiconductor region 102.

In some embodiments, first doped region 108 is in a two-dimensional plane which is parallel to the second reflecting region 106. In some embodiments, first doped region 108 is a three-dimensional structure over the second doped region 110 and the second reflecting region 106. In some embodiments, first doped region 108 is along the semiconductor region 102/first reflecting region 104 interface.

In some embodiments, first transverse region 108a is in a two-dimensional plane which is parallel to the second reflecting region 106. In some embodiments, first transverse region 108a is a three-dimensional structure over second doped region 110 and the second reflecting region 106. In some embodiments, first transverse region 108a is parallel to the semiconductor region 102/first reflecting region 104 interface. In some embodiments, first transverse region 108a is across the semiconductor region 102.

In some embodiments, first contact region 108b is in a two-dimensional plane which is parallel to the second reflecting region 106. In some embodiments, first contact region 108b is a three-dimensional structure over second doped region 110 and the second reflecting region 106. In some embodiments, second contact region 108c is in a two-dimensional plane which is parallel to the second reflecting region 106. In some embodiments, second contact region 108c is a three-dimensional structure over second doped region 110 and the second reflecting region 106. In some embodiments, first contact region 108b is electrically connected to first conductive line 116. In some embodiments, second contact region 108c is electrically connected to second conductive line 118.

In some embodiments, second contact region 108c is in a two-dimensional plane which is parallel to the first contact region 108b. In some embodiments, first contact region 108b and second contact region 108c have substantially equal vertical positioning with respect to the first reflecting region 104. In some embodiments, first contact region 108b and second contact region 108c have different vertical positioning with respect to the first reflecting region 104. In some embodiments, first contact region 108b and second contact region 108c are the same height with respect to the first reflecting region 104. In some embodiments, first contact region 108b and second contact region 108c are a different height with respect to the first reflecting region 104. In some embodiments, first transverse region 108a, first contact region 108b or second contact region 108c has a multi-layer structure.

Second doped region 110 is over the second reflecting region 106. In some embodiments, second doped region 110 is in a two-dimensional plane which is parallel to the second reflecting region 106. In some embodiments, second doped region 110 is a three-dimensional structure over second reflecting region 106. In some embodiments, second doped region 110 is along the semiconductor region 102/second reflecting region 106 interface. In some embodiments, second doped region 110 is in a lower portion of semiconductor region 102. In some embodiments, second doped region 110 is a contact electrically connected to the third conductive line 120.

In some embodiments, first doped region 108 or second doped region 110 are doped with dopants utilized for Si, Ge, SiGe, SiC, GeSn, SiGeSn or GaN. In some embodiments, first doped region 108 is doped with an n-type material, including Phosphorous, Arsenic or Antimony, or any other suitable material, and second doped region 110 is doped with a p-type material, including Boron, or any other suitable material. In some embodiments, first doped region 108 is doped with a p-type material, including Boron, or any other suitable material, and second doped region 110 is doped with an n-type material, including Phosphorous, Arsenic or Antimony, or any other suitable material.

In some embodiments, the thickness of the first transverse region 108a ranges from about 20 nm to about 500 nm. In some embodiments, the thickness of the first contact region 108b ranges from about 10 nm to about 100 nm. In some embodiments, the thickness of the second contact region 108c ranges from about 10 nm to about 100 nm. In some embodiments, the thickness of the second doped region 110 ranges from about 20 nm to about 200 nm.

In some embodiments, the dopant concentration of the first transverse region 108a ranges from about equal to or greater than $10^{18}$ ions/cm$^3$. In some embodiments, the dopant concentration of the first contact region 108b ranges from about equal to or greater than $10^{19}$ ions/cm$^3$. In some embodiments, the dopant concentration of the second contact region 108b ranges from about equal to or greater than $10^{19}$ ions/cm$^3$. In some embodiments, the dopant concentration of the second doped region 110 ranges from about equal to or greater than $10^{18}$ ions/cm$^3$. In some embodiments, the dopant concentration of the first transverse region 108a is equal to the dopant concentration of the first contact region 108b or the second contact region 108b. In some embodiments, the dopant concentration of the first transverse region 108a is different from the dopant concentration of the first contact region 108b or the second contact region 108b. In some embodiments, the dopant concentration of the first contact region 108b is equal to the dopant concentration of the second contact region 108b. In some embodiments, the dopant concentration of the first contact region 108b is different from the dopant concentration of the second contact region 108b.

First insulating region 112 extends circumferentially around the outer surface of first conductive line 116. First insulating region 112 electrically isolates the first conductive line 116 from the second doped region 110. First insulating region 112 electrically isolates the first doped region 108 from the second doped region 110. In some embodiments, the first insulating region 112 includes a dielectric material including SiO$_2$, SiNx or low-k dielectric; any other suitable material; or combinations thereof. A low-k dielectric material has a dielectric constant less than that of silicon dioxide. In some embodiments, the first insulating region 112 is formed by chemical vapor deposition (CVD), atomic layer deposition (ALD), or other processes. In some embodiments, a thickness of the first insulating region 112 ranges from about 100 nm to about 3000 nm.

Second insulating region 114 extends circumferentially around the outer surface of second conductive line 118. Second insulating region 114 electrically isolates the second conductive line 118 from the second doped region 110. Second insulating region 114 electrically isolates the first doped region 108 from the second doped region 110. In some embodiments, the second insulating region 114 includes a dielectric material including SiO$_2$, SiNx or low-k dielectric; any other suitable material; or combinations thereof. In some embodiments, the second insulating region 114 is formed by chemical vapor deposition (CVD), atomic layer deposition (ALD), or other processes. In some embodiments, a thickness of the second insulating region 114 ranges from about 100 nm to about 3000 nm.

Second reflecting region 106 is below semiconductor region 102. Second reflecting region 106 includes layers of materials, e.g., second reflecting layers 106a, 106b, 106c, 106d and 106e, having corresponding refractive indices, e.g., $n_{106a}$, $n_{106b}$, $n_{106c}$, $n_{106d}$, and $n_{106e}$. Second reflecting region 106 reflects incident electromagnetic radiation, and improves the efficiency of the BSI photodetector structure 100. In some embodiments, second reflecting region 106 is a distributed Bragg reflector, which uses alternating layers of materials having different refractive indices to reflect emitted light from semiconductor region 102. In some embodiments, the second reflecting region 106 is flush against semiconductor region 102.

Second reflecting region 106 includes second reflecting layers 106a, 106b, 106c, 106d and 106e. In some embodiments, second reflecting region 106 includes one or more reflecting layers. Second reflecting layer 106e is over second reflecting layer 106d, second reflecting layer 106c, second reflecting layer 106b and second reflecting layer 106a. Second reflecting layer 106d is over second reflecting layer 106c, second reflecting layer 106b and second reflecting layer 106a. Second reflecting layer 106c is over second reflecting layer 106b and second reflecting layer 106a. Second reflecting layer 106b is over second reflecting layer 106a.

In some embodiments, second reflecting region 106 is in a two-dimensional plane which is parallel to the semiconductor region 102. In some embodiments, second reflecting region 106 is a three-dimensional structure over first conductive layer 122, second conductive layer 124 and third conductive layer 126. In some embodiments, each second reflecting layer 106a, 106b, 106c, 106d and 106e is in a two-dimensional plane which is parallel to each second reflecting layer 106a, 106b, 106c, 106d and 106e.

In some embodiments, second reflecting region 106 comprises a stack of alternating layers of reflecting materials, e.g., second reflecting layers 106a, 106b, 106c, 106d and 106e, with alternating high and low refractive indices. In some embodiments, second reflecting layers 106a and 106c are the same material and the corresponding indices of refraction, $n_{106a}$ and $n_{106c}$, are equal. In some embodiments, second reflecting layers 106c and 106e are the same material and the corresponding indices of refraction, $n_{106c}$ and $n_{106e}$, are equal. In some embodiments, second reflecting layers 106a and 106e are the same material and the corresponding indices of refraction, $n_{106a}$ and $n_{106e}$, are equal. In some embodiments, second reflecting layers 106b and 106d are the same material and the corresponding indices of refraction, $n_{106b}$ and $n_{106d}$, are equal. In some embodiments, second reflecting layer 106a is a different material from second reflecting layer 106b, and the corresponding indices of refraction, $n_{106a}$ and $n_{106b}$, are not equal. In some embodiments, second reflecting layer 106c is a different material from second reflecting layer 106b, and the corresponding indices of refraction, $n_{106c}$ and $n_{106b}$, are not equal. In some embodiments, second reflecting layer 106c is a different material from second reflecting layer 106d, and the corresponding indices of refraction, $n_{106c}$ and $n_{106d}$, are not equal. In some embodiments, second reflecting layer 106e is a different material from second reflecting layer 106d, and the corresponding indices of refraction, $n_{106e}$ and $n_{106d}$, are not equal.

In some embodiments, the refraction index contrast of each alternating high and low refractive index is about 0.5 or greater. In some embodiments, one or more of second reflecting layers 106a, 106b, 106c, 106d or 106e include high refractive index materials comprising SiNx, AlN, Si, high-k dielectrics; any other suitable material; or combinations thereof. In some embodiments, one or more of second reflecting layers 106a, 106b, 106c, 106d or 106e include low refractive index materials comprising $SiO_2$, low-k dielectrics; any other suitable material; or combinations thereof. In some embodiments, at a wavelength ranging from about 1.0 µm to about 3.0 µm, the index of refraction ($n_{106a}$) for the second reflecting layer 106a ranges from about 1.3 to about 2.0. In some embodiments, at a wavelength ranging from about 1.0 µm to about 3.0 µm, the index of refraction ($n_{106c}$) for the second reflecting layer 106c ranges from about 1.3 to about 2.0. In some embodiments, at a wavelength ranging from about 1.0 µm to about 3.0 µm, the index of refraction ($n_{106e}$) for the second reflecting layer 106e ranges from about 1.3 to about 2.0. In some embodiments, at a wavelength ranging from about 1.0 µm to about 3.0 µm, the index of refraction ($n_{106b}$) for the second reflecting layer 106b ranges from about 1.6 to about 2.8. In some embodiments, at a wavelength ranging from about 1.0 µm to about 3.0 µm, the index of refraction ($n_{106d}$) for the second reflecting layer 106d ranges from about 1.6 to about 2.8.

In some embodiments, a reflectivity of the second reflecting region 106 ranges from about 80% or greater. In some embodiments, the second reflecting region 106 reduces light leakage since the second reflecting region 106 is a high reflectivity structure. In some embodiments, the number of second reflecting layers ranges from about 2 layers to about 20 layers. In some embodiments, the thickness of each second reflecting layer 106a, 106b, 106c, 106d and 106e ranges from about 60 nm to about 500 nm. In some embodiments, the second reflecting region 106 is formed by CVD, ALD, or other processes. In some embodiments, the second reflecting region 106 has a multilayer structure and is formed in a multiple-step process.

First conductive line 116 extends through second reflecting region 106 and partially through semiconductor region 102 and first insulating region 112. First conductive line 116 is used to electrically connect first conductive layer 122 to first doped region 108 by first contact region 108b. In some embodiments, first conductive line 116 is a metal line, a via, a through silicon via (TSV), an inter-level via (ILV), or another suitable conductive line. In some embodiments, first conductive line 116 includes copper, cobalt, aluminum, nickel, titanium, tungsten or another suitable conductive material. In some embodiments, first conductive line 116 is a same material as first conductive layer 122. In some embodiments, first conductive line 116 is a different material from first conductive layer 122. In some embodiments, first conductive line 116 includes one or more conductive line portions. In some embodiments, first conductive line 116 partially extends through a center region of first insulating region 112.

First conductive layer 122 is adjacent to second reflecting region 106 and is used to electrically connect to the first doped region 108 by the first conductive line 116. In some embodiments, first conductive layer 122 is below the second reflecting region 106. In some embodiments, first conductive layer 122 is flush against second reflecting region 106. In some embodiments, the first conductive layer 122 includes more than one conductive portion. In some embodiments, first conductive layer 122 is in a two-dimensional plane. In some embodiments, first conductive layer 122 is a three-dimensional structure. In some embodiments, the three-dimensional structure includes a combination of conductive lines on different layers of BSI photodetector structure 100. In some embodiments, first conductive layer 122 extends parallel to the second reflecting region 106. In some embodiments, first conductive layer 122 extends along an angled direction with respect to an x-axis and a y-axis of BSI photodetector structure 100.

In some embodiments, first conductive layer 122 includes a single port for either receiving or outputting an electrical current. In some embodiments, first conductive layer 122 includes more than one port and is capable of both receiving and outputting an electrical current. In some embodiments, first conductive layer 122 includes copper, cobalt, aluminum, nickel, tungsten, titanium, or another suitable conductive material. In some embodiments, a thickness of the first conductive layer 122 ranges from about 0.5 µm to about 5 µm.

Second conductive line 118 extends through second reflecting region 106 and partially through semiconductor region 102 and second insulating region 114. Second conductive line 118 is used to electrically connect second conductive layer 124 to first doped region 108 by second contact region 108c. In some embodiments, second conductive line 118 is a metal line, a via, a through silicon via (TSV), an inter-level via (ILV), or another suitable conductive line. In some embodiments, second conductive line 118 includes copper, cobalt, aluminum, nickel, titanium, tungsten or another suitable conductive material. In some embodiments, second conductive line 118 is a same material as second conductive layer 124. In some embodiments, second conductive line 118 is a different material from second conductive layer 124. In some embodiments, second conductive line 118 includes one or more conductive line portions. In some embodiments, second conductive line 118 partially extends through a center region of second insulating region 114.

Second conductive layer 124 is adjacent to second reflecting region 106 and is used to electrically connect to the first doped region 108 by the first conductive line 116. In some embodiments, second conductive layer 124 is below the second reflecting region 106. In some embodiments, second conductive layer 124 is flush against second reflecting region 106. In some embodiments, the second conductive layer 124 includes more than one conductive portion. In some embodiments, second conductive layer 124 is in a two-dimensional plane. In some embodiments, second conductive layer 124 is a three-dimensional structure. In some embodiments, the three-dimensional structure includes a combination of conductive lines on different layers of BSI photodetector structure 100. In some embodiments, second conductive layer 124 extends parallel to second reflecting region 106. In some embodiments, second conductive layer 124 extends along an angled direction with respect to an x-axis and a y-axis of BSI photodetector structure 100.

In some embodiments, second conductive layer 124 includes a single port for either receiving or outputting an electrical current. In some embodiments, second conductive layer 124 includes more than one port and is capable of both receiving and outputting an electrical current. In some embodiments, second conductive layer 124 includes copper, cobalt, aluminum, nickel, tungsten, titanium, or another suitable conductive material. In some embodiments, a thickness of the second conductive layer 124 ranges from about 0.5 µm to about 5 µm.

Third conductive line 120 extends through second reflecting region 106 and partially through semiconductor region 102. Third conductive line 120 is used to electrically connect third conductive layer 126 to second doped region 110. In some embodiments, third conductive line 120 is a metal line, a via, a through silicon via (TSV), an inter-level via (ILV), or another suitable conductive line. In some embodiments, third conductive line 120 includes copper, cobalt, aluminum, nickel, titanium, tungsten or another suitable conductive material. In some embodiments, third conductive line 120 is a same material as third conductive layer 126. In some embodiments, third conductive line 120 is a different material from third conductive layer 126. In some embodiments, third conductive line 120 includes one or more conductive line portions.

Third conductive layer 126 is adjacent to second reflecting region 106 and is electrically connected to the second doped region 110 by the third conductive line 120. In some embodiments, third conductive layer 126 is below the second reflecting region 106. In some embodiments, third conductive layer 126 is flush against second reflecting region 106. In some embodiments, the third conductive layer 126 includes more than one conductive portion. In some embodiments, third conductive layer 126 is in a two-dimensional plane. In some embodiments, third conductive layer 126 is a three-dimensional structure. In some embodiments, the three-dimensional structure includes a combination of conductive lines on different layers of BSI photodetector structure 100. In some embodiments, third conductive layer 126 extends parallel to second reflecting region 106. In some embodiments, third conductive layer 126 extends along an angled direction with respect to an x-axis and a y-axis of BSI photodetector structure 100.

In some embodiments, third conductive layer 126 includes a single port for either receiving or outputting an electrical current. In some embodiments, third conductive layer 126 includes more than one port and is capable of both receiving and outputting an electrical current. In some embodiments, third conductive layer 126 includes copper, cobalt, aluminum, nickel, tungsten, titanium, or another suitable conductive material. In some embodiments, a thickness of the third conductive layer 126 ranges from about 0.5 µm to about 5 µm.

A first conductive layer 122 and third conductive layer 126 are placed adjacent to another and separated by a distance D1. The placement of the first conductive layer 122 and third conductive layer 126 forms a first opening 128 between each conductive layer. The first opening 128 has a width of distance D1. In some embodiments, the distance D1 is a diameter of the first opening 128. In some embodiments, first opening 128 is circular, rectangular, square, hexagonal, or other geometric shapes.

A second conductive layer 124 and third conductive layer 126 are placed adjacent to another and separated by a distance D2. The placement of the second conductive layer 124 and third conductive layer 126 forms a second opening 130 between each conductive layer. The second opening 130 has a width of distance D2. In some embodiments, the distance D2 is a diameter of the second opening 130. In some embodiments, second opening 130 is circular, rectangular, square, hexagonal, or other geometric shapes.

In an embodiment, the BSI photodetector structure 100 receives electromagnetic radiation from an electromagnetic radiation source (not shown) on the backside surface, e.g., first side 102a. In some embodiments, an optical bandwidth, e.g., measured as a full-width at half maximum (FWHM), of the BSI photodetector structure 100 ranges from about 0.5 Gigahertz (GHz) to about 50 GHz. In some embodiments, a wavelength of the received electromagnetic radiation ranges from about 200 nm to about 2000 nm. In some embodiments, the electromagnetic radiation includes ultraviolet light, visible light or infrared light. In some embodiments, the BSI photodetector structure 100 has improved sensitivity by utilizing a resonant cavity to enhance the optical intensity inside the absorption region, e.g., semiconductor region 102.

In some embodiments, an intrinsic Quantum Efficiency of the BSI photodetector structure 100 ranges from about 1% to about 100%. In some embodiments, a Responsivity of the BSI photodetector structure 100 ranges from about 0.1 A/W to about 10 A/W.

Figure 2:
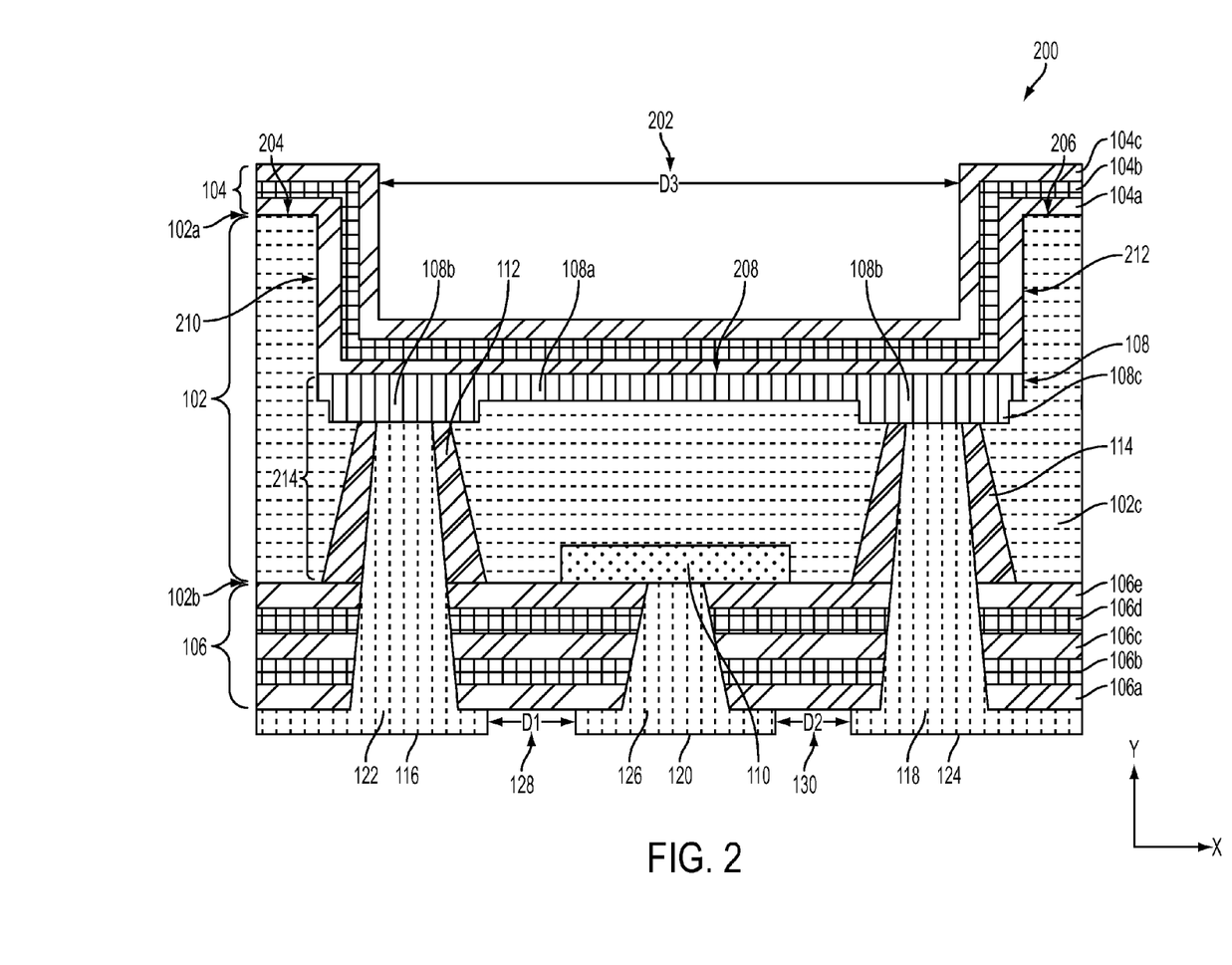
FIG. 2 is a cross sectional view of a BSI Photodetector structure in accordance with one or more embodiments.

FIG. 2 is a cross-sectional view of a BSI photodetector structure 200 in accordance with one or more embodiments. BSI photodetector structure 200 is an embodiment of BSI photodetector structure 100 (shown in FIG. 1) with similar elements. As shown in FIG. 2, similar elements have a same reference number as shown in FIG. 1. In comparison with BSI photodetector structure 100 (shown in FIG. 1), BSI photodetector structure 200 includes a recessed portion 202 of semiconductor region 102. The semiconductor region 102 comprises a first side 102a and a second side 102b. The second side 102b is an opposite side of the semiconductor region 102 from the first side 102a. The first side 102a includes a recess portion 202, a first surface 204 and a second surface 206. The recess portion 202 includes a first recess surface 208, a second recess surface 210 and a third recess surface 212. The recess portion 202 has a width of distance D3. In some embodiments, the recess portion 202 is circular, rectangular, square, hexagonal, or other geometric shapes. In some embodiments, a distance D3 ranges from about 3 µm to about 150 µm.

In some embodiments, the semiconductor region 102 is partitioned by the recess portion 202. In some embodiments, the recess portion 202 forms a modified semiconductor region 214 of semiconductor region 102. In some embodiments, modified semiconductor region 214 is a central region of semiconductor region 102. In some embodiments, the semiconductor region 102 includes modified semiconductor region 214. Semiconductor region 102 has a corresponding thickness and modified semiconductor region 214 has a corresponding thickness. In various embodiments, semiconductor region 102 has a thickness from a first side 102a to a second side 102b. In some embodiments, the thickness of the modified semiconductor region 214 ranges from about 0.2 µm to about 5 µm. In some embodiments, the thickness of the semiconductor region 102 ranges from about 0.2 µm to about 5 µm.

In some embodiments, the first recess surface 208 is below the first surface 204 or second surface 206. In some embodiments, the first recess surface 208 is substantially horizontal. In some embodiments, the second recess surface 210 is substantially vertical. In some embodiments, the third recess surface 212 is substantially vertical. In some embodiments, the first surface 204 is substantially horizontal. In some embodiments, the second surface 206 is substantially horizontal. In some embodiments, the first surface 204 and the second surface 206 are substantially coplanar.

In some embodiments, the first reflecting region 104 is flush against the first side 102a of the semiconductor region 102. In some embodiments, the first reflecting region 104 is in a two-dimensional plane which is parallel to the first surface 204 of the semiconductor region 102. In some embodiments, the first reflecting region 104 is in a two-dimensional plane which is parallel to the second surface 206 of the semiconductor region 102. In some embodiments, the first reflecting region 104 is in a two-dimensional plane which is parallel to the first recess surface 208 of the semiconductor region 102. In some embodiments, the first reflecting region 104 is in a two-dimensional plane which is parallel to the second recess surface 210 of the semiconductor region 102. In some embodiments, the first reflecting region 104 is in a two-dimensional plane which is parallel to the third recess surface 212 of the semiconductor region 102.

In some embodiments, the recess portion 202 of BSI photodetector structure 200 has improved sensitivity by utilizing a resonant cavity to enhance the optical intensity inside the absorption region, e.g., semiconductor region 102. In some embodiments, the thickness of each first reflecting layer 104a, 104b and 104c is controlled in order to collect sufficient radiation.

In some embodiments, an intrinsic Quantum Efficiency of the BSI photodetector structure 200 ranges from about 1% to about 100%. In some embodiments, a Responsivity of the BSI photodetector structure 200 ranges from about 0.1 A/W to about 10 A/W.

In some embodiments, the thickness of each first reflecting layer 104a, 104b and 104c is controlled by CMP or wet etch smoothing of the first side 102a of semiconductor region 102 after grinding/polishing. In some embodiments, the smoothing of the first side 102a of semiconductor region includes silicon wet etching for top surface roughness control. In some embodiments, the recess portion 202 of the semiconductor region 102 is formed by grinding the semiconductor region 102 to a thickness range of about 100 µm to about 200 µm by CMP. In some embodiments, after CMP, the recess portion 202 of the semiconductor region 102 is formed by wet etching the semiconductor region 102. In some embodiments, the wet etching includes silicon wet etching. In some embodiments, the silicon wet etching includes using TMAH or KOH; any other suitable material; or combinations thereof; and a mask including SiNx, SiO$_2$ or Cu; any other suitable material; or combinations thereof. In some embodiments, the semiconductor region 102 is wet etched until the modified semiconductor region 214 has a thickness range of about 0.2 µm to about 5 µm.

Figure 3:
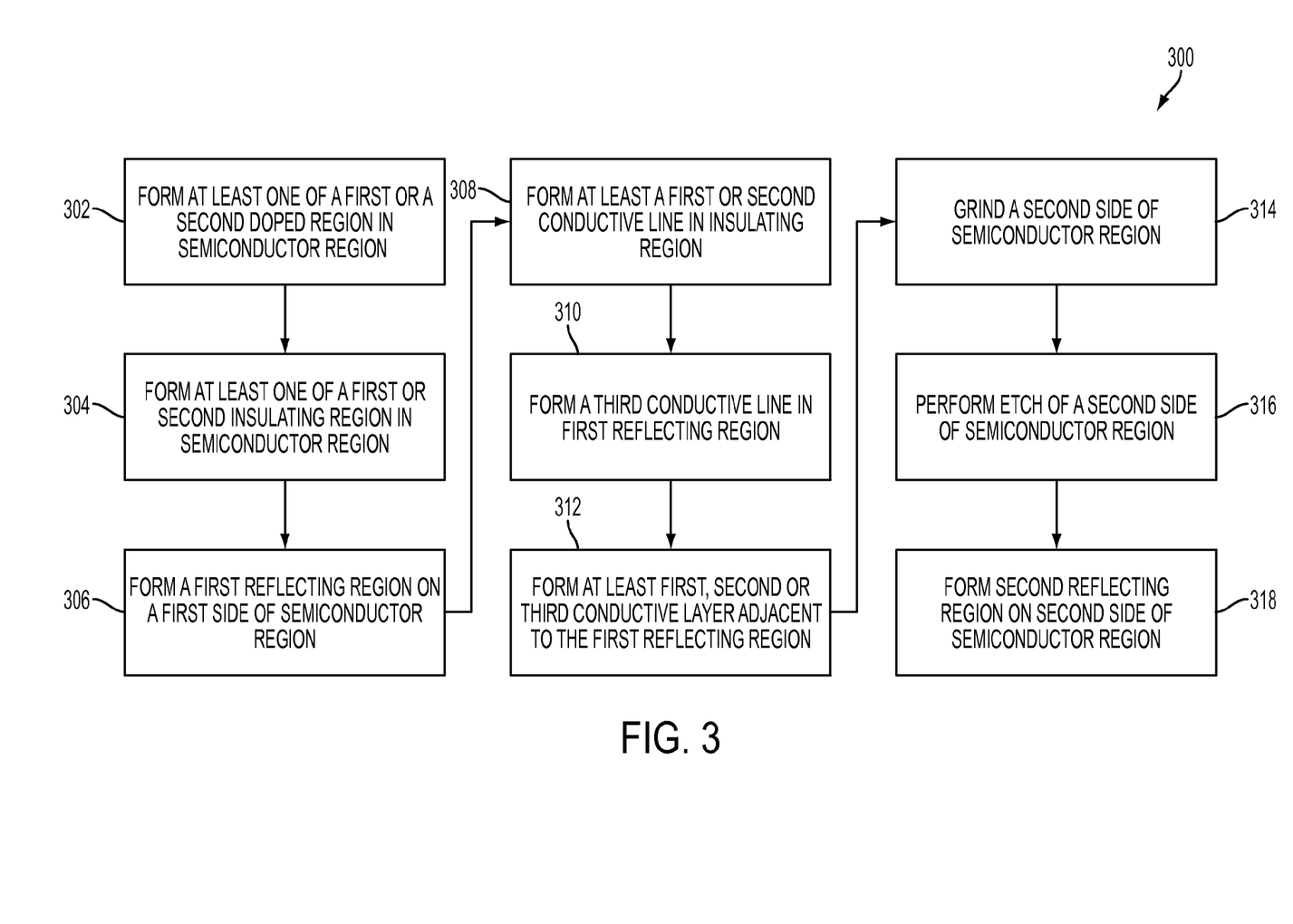
FIG. 3 is a flow chart of a method of making a BSI Photodetector structure in accordance with one or more embodiments.

FIG. 3 is a flow chart of a method 300 of making a BSI photodetector structure in accordance with one or more embodiments. Method 300 begins with operation 302 in which at least one first or second doped region, e.g., first doped region 108 or second doped region 110, is formed in a semiconductor, e.g., a semiconductor region 102 (FIG. 1). In some embodiments, at least one first or second doped region is doped with dopants suitable for Silicon, Germanium, SiGe, SiC, GeSn, SiGeSn or GaN. In some embodiments, the first or second doped regions are formed using implantation, diffusion or other suitable formation processes. In some embodiments, the first or second doped regions are formed using high energy implantation or other suitable formation processes.

Method 300 continues with operation 304 in which at least one of a first or second insulating region, e.g., first insulating region 112 (FIG. 1) or second insulating region 114 (FIG. 1), is formed in the semiconductor region, e.g., semiconductor region 102 (FIG. 1). In some embodiments, the first or second insulating region is formed using CVD, ALD, spin-on polymeric dielectric or other suitable formation processes.

Method 300 continues with operation 306 in which a first reflecting region, e.g., second reflecting region 106 (FIGS. 1 and 2), is formed on a first side of the semiconductor region, e.g., second side 102b of the semiconductor region 102 (FIG. 2). In some embodiments, the first reflecting region comprises a stack of alternating layers of reflecting materials, e.g., second reflecting layers 106a, 106b, 106c, 106d and 106e, with alternating high and low refractive indices. In some embodiments, one or more of first reflecting layers include high refractive index materials comprising SiNx, AlN, Si, high-k dielectrics; any other suitable material; or combinations thereof. In some embodiments, one or more of first reflecting layers include low refractive index materials comprising SiO$_2$, low-k dielectrics; any other suitable material; or combinations thereof. In some embodiments, the first reflecting region is formed by CVD, ALD, or other processes. In some embodiments, the first reflecting region has a multilayer structure and is formed in a multiple-step process.

Method 300 continues with operation 308 in which at least a first or a second conductive line, e.g., first conductive line 116 or second conductive line 118 (FIG. 1), is formed in the first or second insulating region, e.g., first insulating region 112 second insulating region 114 (FIG. 2). In some embodiments, the first or second conductive line is formed using a combination of photolithography and material removal processes to form openings in the insulating region. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a plasma etching process, a wet etching process, a dry etching process, an RIE process, laser drilling or another suitable etching process. The openings are then filled with conductive material, e.g., copper, cobalt aluminum, titanium, nickel, tungsten, or other suitable conductive material. In some embodiments, the openings are filled using CVD, PVD, sputtering, ALD or other suitable formation process.

Method 300 continues with operation 310 in which third conductive line, e.g., third conductive line 120 (FIG. 1), is formed in the first reflecting region, e.g., second reflecting region 106 (FIG. 1). In some embodiments, the third conductive line is formed using a combination of photolithography and material removal processes to form openings in the first reflecting region. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a plasma etching process, a wet etching process, a dry etching process, an RIE process, laser drilling or another suitable etching process. The openings are then filled with conductive material, e.g., copper, cobalt aluminum, titanium, nickel, tungsten, or other suitable conductive material. In some embodiments, the openings are filled using CVD, PVD, sputtering, ALD or other suitable formation process.

Method 300 continues with operation 312 in which at least one conductive layer, e.g., first conductive layer 122 (FIG. 1), second conductive layer 124 (FIG. 1) or third conductive layer 126 (FIG. 3), is formed adjacent to the first reflecting region, e.g. second reflecting region 106 (FIG. 1). In some embodiments, the conductive layer is formed using a combination of photolithography and material removal processes to form openings in the first reflecting region. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, cobalt, aluminum, titanium, nickel, tungsten, or other suitable conductive material. In some embodiments, the openings are filled using CVD, PVD, sputtering, ALD or other suitable formation process.

Method 300 continues with operation 314 in which a second side of the semiconductor region, e.g., first side 102a of the semiconductor region 102 (FIG. 1), is grinded. In some embodiments, the second side of semiconductor region is grinded with CMP or other suitable formation processes. In some embodiments, the semiconductor region is grinded to a thickness range of about 100 μm to about 200 μm. In some embodiments, the semiconductor region is grinded to a thickness range of about 0.2 μm to about 5 μm. In some embodiments, the BSI photodetector structure, e.g. BSI photodetector structure 100 (FIG. 1) or BSI photodetector structure 200 (FIG. 2), is connected to a carrier structure, prior to grinding, using a laser bonding process, a conductive adhesive layer, a soldering bump process or another suitable bonding process.

Method 300 continues with operation 316 in which a second side of the semiconductor region, e.g., first side 102a of the semiconductor region 102 (FIG. 1), is etched. In some embodiments, the second side of semiconductor region is wet etched or etched with other suitable formation processes. In some embodiments, the etching of the first side 102a of semiconductor region includes wet etching. In some embodiments, the wet etching includes silicon wet etching. In some embodiments, the silicon wet etching includes using TMAH or KOH; any other suitable material; or combinations thereof; and a mask including SiNx, SiO$_2$ or Cu; any other suitable material; or combinations thereof. In some embodiments, the second side of the semiconductor region is etched until a portion of the semiconductor region, e.g. modified semiconductor region 214, has a thickness range of about 0.5 μm to about 5 μm. In some embodiments, a recess portion of the semiconductor region, e.g., recess portion 202 of the semiconductor region 102, is formed on the second side of the semiconductor region, e.g., first side 102a of semiconductor region 102, by etching a portion of the second side of the semiconductor region, e.g., modified semiconductor region 214, until the portion of the semiconductor region has a thickness range of about 0.5 μm to about 5 μm. In some embodiments, the second side of the semiconductor region is etched for smoothing/roughness control.

Method 300 continues with operation 318 in which a second reflecting region, e.g., first reflecting region 104 (FIGS. 1 and 2), is formed on a second side of the semiconductor region, e.g., first side 102a of the semiconductor region 102 (FIGS. 1 & 2). In some embodiments, the second reflecting region comprises a stack of alternating layers of reflecting materials, e.g., first reflecting layers 104a, 104b and 104c, with alternating high and low refractive indices. In some embodiments, one or more of the second reflecting layers include high refractive index materials comprising SiNx, AlN, Si, high-k dielectrics; any other suitable material; or combinations thereof. In some embodiments, one or more of the second reflecting layers include low refractive index materials comprising SiO$_2$, low-k dielectrics; any other suitable material; or combinations thereof. In some embodiments, the second reflecting region is formed by CVD, ALD, or other processes. In some embodiments, the second reflecting region has a multilayer structure and is formed in a multiple-step process. In some embodiments, the BSI photodetector structure, e.g. BSI photodetector structure 100 (FIG. 1) or BSI photodetector structure 200 (FIG. 2), is disconnected from a carrier structure, after the second reflecting region is formed, using a laser debonding process, or another suitable debonding process.

One of ordinary skill in the art would recognize that an order of operations in method 300 is adjustable. One of ordinary skill in the art would further recognize that additional steps are able to be included in method 300 without departing from the scope of this description.

One aspect of this description relates to a backside-illuminated photodetector structure comprising a first reflecting region, a second reflecting region and a semiconductor region. The semiconductor region is between the first reflecting region and the second reflecting region. The semiconductor region comprises a first doped region and a second doped region.

Another aspect of this description relates to a backside-illuminated photodetector structure comprising a semiconductor region. The semiconductor region comprises a first doped region, a second doped region, a first side and a second side. The second side is an opposite side of the semiconductor region from the first side. The first side comprises a recess portion. The backside-illuminated photodetector device further comprising a first reflecting region on the first side of the semiconductor region and a second reflecting region on the second side of the semiconductor region.

Still another aspect of this description relates to a method of making a backside-illuminated photodetector structure, the method comprising forming at least one of a first doped region or a second doped region in a semiconductor region, forming a first reflecting region on a first side of a semiconductor region and forming a second reflecting region on a second side of a semiconductor region.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A backside-illuminated (BSI) photodetector structure comprising:
   a first reflecting region comprising a first distributed Bragg reflector;
   a second reflecting region comprising a second distributed Bragg reflector; and a semiconductor region, wherein the semiconductor region is between the first reflecting region and the second reflecting region, and the semiconductor region comprises:
   a first doped region extending from a first surface of the semiconductor region to a first intermediate level of the semiconductor region, wherein the first doped region is of a first conductivity type and has a first dopant concentration, and the first doped region comprises:
     a contact region; and
     a transverse region, wherein the contact region extends deeper than the transverse region in a direction pointing from the first surface to an opposite second surface of the semiconductor region;
   a recess extending from an additional top surface of the semiconductor region to the first surface, with the additional top surface being higher than the first surface, wherein an entirety of the first doped region is underlying and overlapped by the recess;
   a second doped region extending from the second surface of the semiconductor region to a second intermediate level of the semiconductor region, wherein the second doped region is of a second conductivity type and has a second dopant concentration, with the second conductivity type opposite to the first conductivity type; and
   a third doped region extending from the first intermediate level to the second intermediate level, wherein the third doped region has the first conductivity type, and a third dopant concentration of the third doped region is lower than the first dopant concentration and the second dopant concentration.

2. The BSI photodetector of claim 1, wherein the first doped region comprises one of a P-doped region or an N-doped region.

3. The BSI photodetector of claim 1, wherein the first reflecting region or the second reflecting region comprises SiNx, AlN, Si or a high-k dielectric material.

4. The BSI photodetector of claim 1, wherein the first reflecting region or the second reflecting region comprises $SiO_2$ or a low-k dielectric material.

5. A backside-illuminated (BSI) photodetector structure comprising:
   a semiconductor region, wherein the semiconductor region comprises:
     a first doped region;
     a second doped region, wherein the first doped region and the second doped region are parts of a photodetector;
     a first surface, with a recess extending from the first surface into the semiconductor region, wherein an entirety of the first doped region is under and overlapped by the recess, and the first doped region comprises:
       a contact region; and
       a transverse region; and
     a second surface, wherein the first surface and the second surface are opposite surfaces of the semiconductor region, and the contact region extends further than the transverse region in a direction pointing from the first surface to the second surface of the semiconductor region;
   a first reflecting region on a first side of the semiconductor region, the first reflecting region comprising a first distributed Bragg reflector in contact with the first surface of the semiconductor region; and
   a second reflecting region on a second side of the semiconductor region and underlying the semiconductor region, the second reflecting region comprising a second distributed Bragg reflector in contact with the second surface of the semiconductor region.

6. The BSI photodetector of claim 5, wherein the recess comprises:
   a first recess surface, wherein the first recess surface is substantially horizontal;
   a second recess surface, wherein the second recess surface is vertical; and
   a third recess surface, wherein the third recess surface is substantially vertical.

7. The BSI photodetector of claim 5, wherein the first distributed Bragg reflector reflecting region or the second distributed Bragg reflector reflecting region comprises a number of reflecting layers ranging from about 2 layers to about 20 layers.

8. The BSI photodetector of claim 5, wherein the first distributed Bragg reflector reflecting region or the second distributed Bragg reflector reflecting region comprises:
   a first layer, wherein the first layer is associated with a corresponding first refraction index; and
   a second layer, wherein the second layer is associated with a corresponding second refraction index.

9. The BSI photodetector of claim 8, wherein the first refraction index and the second refraction index comprises a refraction index contrast between the first refraction index and the second refraction index, wherein the refraction index contrast is greater than 0.5.

10. A method of making a backside-illuminated (BSI) photodetector device, the method comprising:
   forming a recess extending from a first surface of a semiconductor region into the semiconductor region and toward an opposite second surface of the semiconductor region;
   forming a first doped region and a second doped region in a semiconductor region, wherein an entirety of the first doped region is under and overlapped by the recess, and the first doped region comprises:
     a contact region; and
     a transverse region, wherein the contact region extends further than the transverse region in a direction pointing from the first surface to the second surface of the semiconductor region;
   forming a first reflecting region on a first side of a semiconductor region, the first reflecting region comprising a first distributed Bragg reflector in contact with the first surface of the semiconductor region; and
   forming a second reflecting region on a second side of a semiconductor region and underlying the semiconductor region, the second reflecting region comprising a second distributed Bragg reflector in contact with a second surface of the semiconductor region, wherein the first surface and the second surface are opposite surfaces of the semiconductor region.

11. The method of claim 10, further comprising:
   forming a conductive line in the semiconductor region, wherein the conductive line is electrically connected to the first doped region or the second doped region; and
   forming a conductive layer adjacent to the first reflecting region.

12. The method of claim 10, further comprising:
grinding the second side of the semiconductor region; and performing an etch of the second side of the semiconductor region.

13. The BSI photodetector of claim 1, wherein the first distributed Bragg reflector is in physical contact with the first surface of the semiconductor region, and the second distributed Bragg reflector is in physical contact with the second surface of the semiconductor region.

14. The BSI photodetector of claim 1 further comprising:
a conductive feature penetrating through the semiconductor region and electrically coupling to the first doped region.

15. The BSI photodetector of claim 5, wherein the first distributed Bragg reflector extends into the recess.

16. The BSI photodetector of claim 5, wherein the second distributed Bragg reflector is in physical contact with the second surface of the semiconductor region.

17. The method of claim 10, wherein the forming the first doped region and the second doped region comprises:

implanting the semiconductor region to form the first doped region extending from the first surface of the semiconductor region into the semiconductor region; and implanting the semiconductor region to form the second doped region extending from the second surface of the semiconductor region into the semiconductor region, wherein the first surface and the second surface are opposite surfaces of the semiconductor region.

18. The BSI photodetector of claim 5, wherein the first distributed Bragg reflector extends into the recess.

19. The BSI photodetector of claim 1, wherein edges of the recess are substantially aligned to respective edges of the semiconductor region.

20. The BSI photodetector of claim 14 further comprising an insulating region in the semiconductor region, wherein the conductive feature is separated from the semiconductor region by the insulating region.

* * * * *